(12) United States Patent
Ilkov et al.

(10) Patent No.: US 9,337,775 B1
(45) Date of Patent: May 10, 2016

(54) SYSTEM AND METHOD FOR A LOW NOISE AMPLIFIER MODULE

(71) Applicant: Infineon Technologies AG, Neubiberg (DE)

(72) Inventors: Nikolay Ilkov, Munich (DE); Paulo Oliveira, Neubiberg (DE); Daniel Kehrer, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/561,789

(22) Filed: Dec. 5, 2014

(51) Int. Cl.
*H03F 3/181* (2006.01)
*H03F 1/02* (2006.01)
*H03F 3/19* (2006.01)

(52) U.S. Cl.
CPC ........... *H03F 1/0205* (2013.01); *H03F 3/19* (2013.01); *H03F 2200/294* (2013.01); *H03F 2200/451* (2013.01)

(58) Field of Classification Search
CPC ............ H03F 3/181; H03F 3/20; H03F 3/187
USPC .................. 330/51, 124 D, 307, 285, 296
See application file for complete search history.

(56) References Cited

U.S. PATENT DOCUMENTS

| | | | |
|---|---|---|---|
| 3,805,164 A * | 4/1974 | Callaway | 455/291 |
| 6,118,338 A | 9/2000 | Frank et al. | |
| 6,211,729 B1 | 4/2001 | Morkner et al. | |
| 6,586,993 B2 | 7/2003 | Macedo | |
| 6,680,647 B2 | 1/2004 | Brown et al. | |
| 6,700,439 B2 | 3/2004 | Jackson | |
| 6,838,933 B2 | 1/2005 | Goyette et al. | |
| 6,864,743 B2 | 3/2005 | Pozdeev | |
| 6,930,546 B2 | 8/2005 | Floyd | |
| 6,977,552 B2 | 12/2005 | Macedo | |
| 7,218,175 B1 * | 5/2007 | Kobayashi | 330/290 |
| 7,340,228 B2 * | 3/2008 | Monroe et al. | 455/127.1 |

(Continued)

FOREIGN PATENT DOCUMENTS

| | | |
|---|---|---|
| JP | 2008028908 A | 2/2008 |
| WO | 2013168665 A1 | 11/2013 |

OTHER PUBLICATIONS

"24 GHz application using MGA-71543, a Low Noise Amplifier with Bypass Switch," Avago Technologies, Design Tip, Jul. 19, 2001, 4 pgs.

(Continued)

*Primary Examiner* — Henry Choe
(74) *Attorney, Agent, or Firm* — Slater Matsil, LLP

(57) ABSTRACT

In accordance with an embodiment, a circuit includes a low noise amplifier transistor disposed on a first integrated circuit, a single pole multi throw (SPMT) switch disposed on a second integrated circuit, and a bypass switch coupled between a control node of the low noise amplifier transistor and an output node of the low noise amplifier transistor. The SPMT switch couples a plurality of module input terminals to a control node of the low noise amplifier transistor, and the bypass switch including a first switch coupled between the control node of the low noise amplifier transistor and an intermediate node, a second switch coupled between the intermediate node and the output node of the low noise amplifier transistor, and a third switch coupled between the intermediate node and a first reference node. The first integrated circuit and the second integrated circuit are disposed on a substrate.

27 Claims, 12 Drawing Sheets

(56) References Cited

U.S. PATENT DOCUMENTS

| | | |
|---|---|---|
| 7,675,359 B2 * | 3/2010 | Vice ................................ 330/51 |
| 7,898,325 B2 | 3/2011 | Hasan Abrar |
| 8,643,433 B2 | 2/2014 | Ho et al. |
| 2008/0143442 A1 * | 6/2008 | Hemmendorff et al. ...... 330/284 |

OTHER PUBLICATIONS

"MGA-71543—Low Noise Amplifier with Mitigated Bypass Switch," Avago Technologies, Data Sheet, Jun. 8, 2012, 24 pgs.

Figures supplied by Inventor, May 6, 2014, 2 pgs.

* cited by examiner

SYSTEM AND METHOD FOR A LOW NOISE AMPLIFIER MODULE

TECHNICAL FIELD

The present disclosure relates generally to an electronic device, and more particularly to a system and method for a low noise amplifier module.

BACKGROUND

Electronic devices used with wireless communication systems, such as cellular phones, GPS receivers, and Wi-Fi enabled notebook and tablet computers, generally contain signal processing systems that have interfaces to the analog world. Such interfaces may include wire line and wireless receivers that receive transmitted power and convert the received power to an analog or digital signal that may be demodulated using analog or digital signal processing techniques. A typical wireless receiver architecture includes a low noise amplifier (LNA) that amplifies the very small signals that may be received by an antenna and passes an amplified signal to later amplification and/or signal processing stages. By providing gain at the LNA, subsequent gain processing stages are made insensitive to noise, thereby enabling a lower system noise figure.

As portable wireless devices have evolved to support multiple standards, it is common for the RF signal path to contain various components such as antenna switches coupled between one or more antennas and one of more RF front end circuits. One example of such a circuit is a multi-standard cellular telephone that can make calls using different standards such as code division multiple access (CDMA), Global System for Mobile Communications (GSM), Long Term Evolution (LTE), and the like. In addition, a particular wireless device may also support IEEE 801.11 Wi-Fi operation and Global Positioning System (GSM). By using an RF switch, an RF front end circuit optimized for CDMA communication may be used for CDMA calls, while and RF front end circuit optimized for GSM communication may be used for GSM calls. In addition, RF switches may be used to implement adjustable matching networks for antennas and power amplifiers, and to provide adjusting tuning for high frequency filters by switching in and out and/or bypassing passive matching and tuning elements. Because attenuation in the RF signal path prior to the LNA may degrade the noise figure of an RF system, the introduction of antenna switches and other components prior to an LNA in order to support multi-standard operation poses various challenges with respect to maintaining an adequate system noise figure.

SUMMARY OF THE INVENTION

In accordance with an embodiment, a circuit includes a low noise amplifier transistor disposed on a first integrated circuit, a single pole multi throw (SPMT) switch disposed on a second integrated circuit, and a bypass switch coupled between a control node of the low noise amplifier transistor and an output node of the low noise amplifier transistor. The SPMT switch couples a plurality of module input terminals to a control node of the low noise amplifier transistor, and the bypass switch including a first switch coupled between the control node of the low noise amplifier transistor and an intermediate node, a second switch coupled between the intermediate node and the output node of the low noise amplifier transistor, and a third switch coupled between the intermediate node and a first reference node. The first integrated circuit and the second integrated circuit are disposed on a substrate.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a low noise amplifier (LNA) module having a single pole multi throw (SPMT) switch disposed on a first chip followed by an LNA in a second chip. The LNA may be bypassed using a bypass switch disposed on either the first chip or the second chip. Both chips may be disposed on a substrate of the module.

In an embodiment, the LNA may be activated, for example, in an RF system in which a low level RF signal is provided by an antenna, and low noise amplification is required to resolve the low level RF signal. The LNA may be bypassed using the bypass switch, for example, in the RF system when the antenna receives a RF signal having a high enough signal level to be resolved without the LNA.

An example of such a system is a cellular telephone that may operate in various signal strength environments. For example, when the cellular telephone is a considerable distance from a base station, such as on a rural highway, the received signal may be weak, and the first signal path having the LNA may be employed to resolve the weak received signal. On the other hand, when the cellular telephone is adjacent to a base station or is in an environment having multiple microcells, the received signal may be very strong and have a sufficient signal to noise ratio (SNR) to be received without using an LNA. In some cases, this signal may even be strong enough to overdrive the LNA. In such cases, the LNA may be bypassed using the bypass switch. In some embodiments, the LNA may be shut down or placed in a low power mode in order to save power.

In some embodiments, the bypass switch is implemented using a "T" switching network in order to prevent capacitive coupling from the output of the LNA to the input of the LNA. By using such a "T" network, the stability of the LNA may be improved by attenuating the feedback path from the output of the LNA to the input of the LNA. In some embodiments, a stability factor of greater than 1 may be achieved.

Figure 1A:
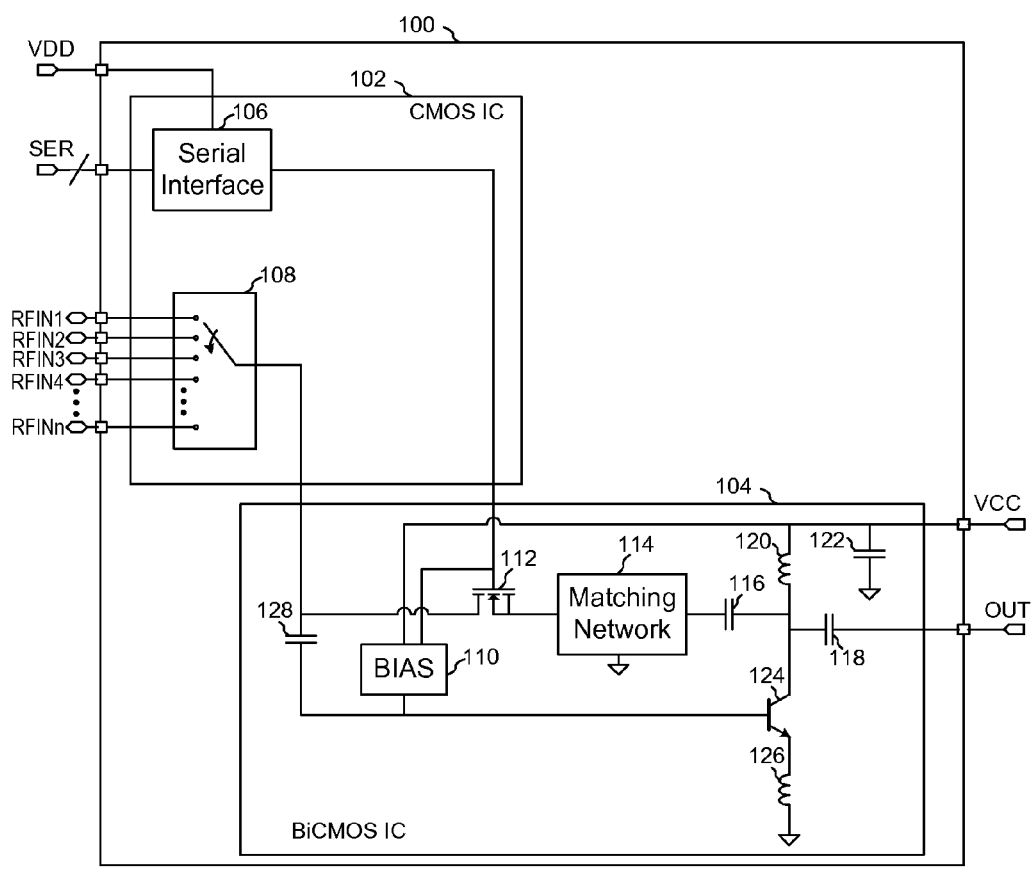
FIGS. 1a-1b illustrate exemplary LNA modules.

FIG. 1a illustrates an exemplary LNA module 100 that includes switch integrated circuit 102 having serial interface 106 and RF selection switch 108 and LNA integrated circuit 104 having LNA transistor 124 that may be bypassed using switching transistor 112. As shown, LNA integrated circuit 104 is implemented in BiCMOS technology and includes input coupling capacitor 128 coupled between the output of RF selection switch 108 and the base of LNA transistor 124. Matching network 114 is coupled in series with switching transistor 112 and coupling capacitor 116 between the base of LNA transistor 124 and the collector of LNA transistor 124. LNA transistor is biased using bias generator 110, choke inductor 120 and degeneration inductor 126. Output terminal OUT of LNA integrated circuit 104 is coupled to the collector of LNA transistor 124 via output coupling capacitor 118. Capacitor 122 provides filtering of power supply terminal VCC.

During operation, LNA transistor 124 may be activated when switching transistor 112 is off or is bypassed when switching transistor 112 is turned on. Control of the state of switching transistor 112 may be determined via serial interface 106 that accepts commands from digital bus SER.

One potential issue with exemplary LNA module 100 is that parasitic capacitance $C_{gs}$ between the gate and source of switching transistor 112 and parasitic capacitance $C_{gd}$ between the gate and drain of switching transistor 112 create a parasitic capacitive feedback path between the collector of LNA transistor 124 and the base of LNA transistor 124. Depending on the particular implementation of LNA module 100 and load conditions, this parasitic capacitance may cause instability when LNA transistor 124 is active. Bias generator 110 may be configured to turn off or reduce the current flowing through LNA transistor 124.

Figure 1B:
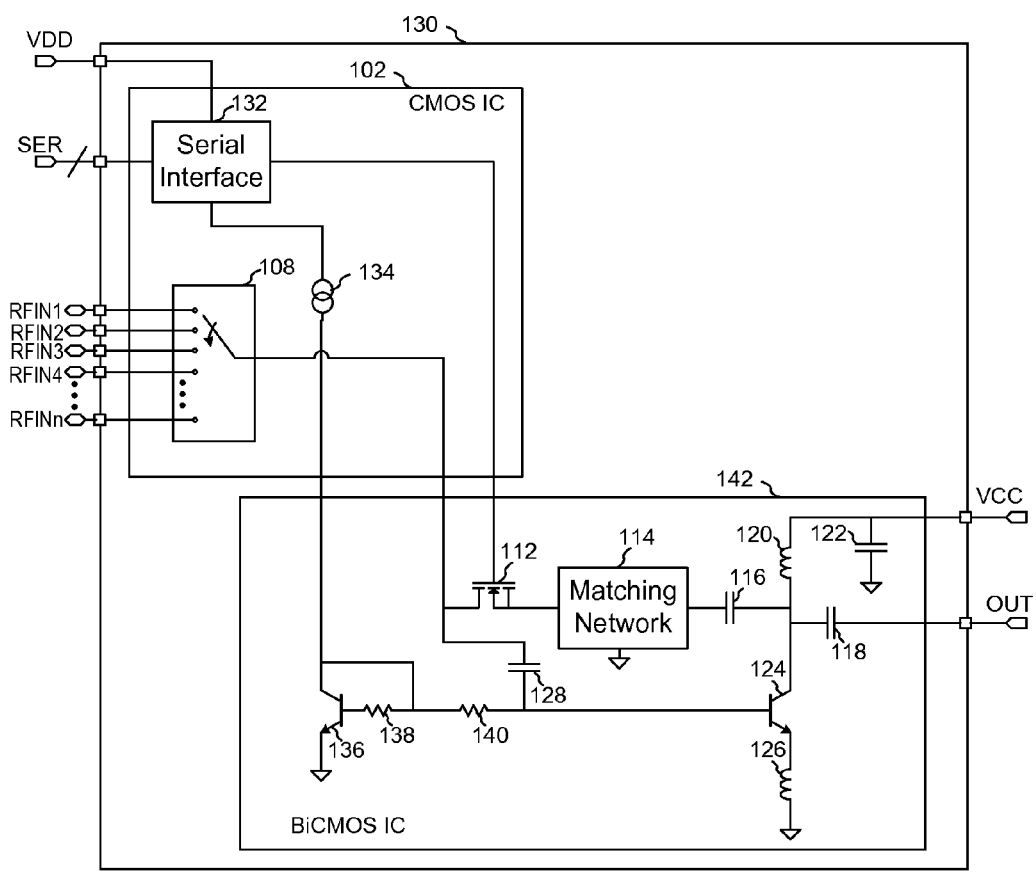

FIG. 1b illustrates a further exemplary LNA module 130 including LNA integrated circuit 142 having diode connected transistor 136 used to provide a bias voltage to the base of LNA transistor 124. As shown, serial interface 132 controls current source 134 that provides a bias current to diode connected transistor 136. In some cases, current source 134 may provide an adjustable current. LNA integrated circuit 142 further includes input coupling capacitor 128 that connects the output of RF selection switch 108 to the base of LNA transistor 124. Resistors 138 and 140 increase the impedance seen at the base of LNA transistor 124 and to compensate for errors that are potentially caused by the base currents of transistors 136 and 124.

Figure 2A:
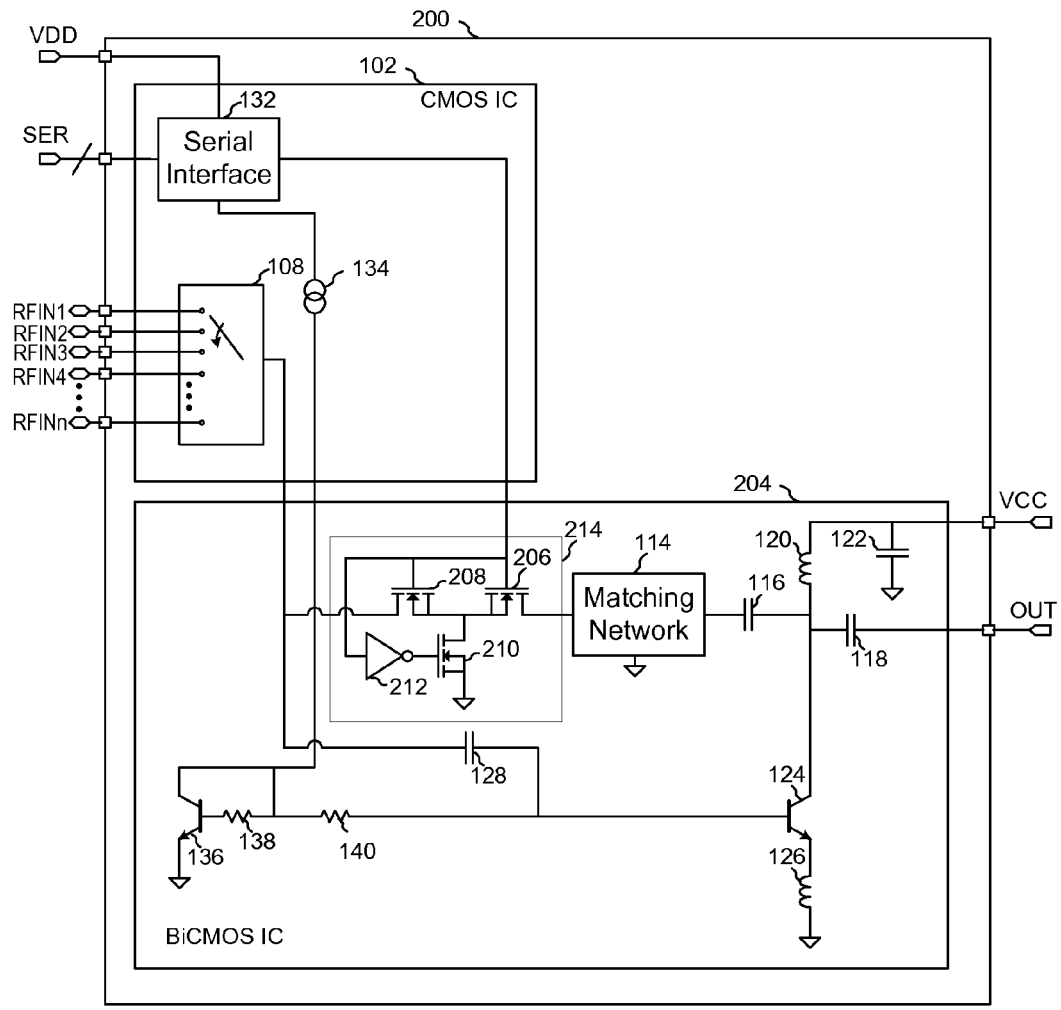
FIGS. 2a-2d illustrate embodiment LNA modules.

FIG. 2a illustrates LNA module 200 according to an embodiment of the present invention that includes switch integrated circuit 102 and LNA integrated circuit 204. As shown, LNA integrated circuit 204 includes bypass switch 214 that includes RF switches 206, 208 and 210. As shown, RF switches 206 and 208 coupled in series and RF switch 210 is coupled between ground and an intermediate node between switches 206 and 208 in a "T" configuration. When bypass switch 214 is closed, switches 206 and 208 are turned on and switch 210 is turned off. When bypass switch 214 is open, switches 206 and 208 are turned on and switch 210 is turned on. In alternative embodiments, bypass switch 214 may be implemented using other bypass switch configurations known in the art. RF switches 206 and 208 are turned on and off based on a signal produced by serial interface 132. Inverter 212 may be used to place RF switch 210 in an opposite state from RF switches 206 and 208. RF switches 206, 208 and 210 may each be implemented using a MOS transistor, and/or may be implemented using RF switch circuits and systems known in the art. For example, each of the RF switches 206, 208 and 210 may be composed of multiple MOS transistors connected in series with gates joined together through high ohmic resistors and with internal source-drain junction points connected with high ohmic resistors to ground to prevent floating. Moreover, RF selection switch 108 may be implemented using RF switch circuits and systems known in the art, such as switches using stacked and/or series transistors fabricated using CMOS, PHEMT, or other technologies. In an embodiment, switch integrated circuit 102 may be implemented using a CMOS process and LNA integrated circuit 204 may be implemented using a BiCMOS process.

In an embodiment, LNA transistor 124 is selected in an active mode by closing RF switches 206 and 208 and opening RF switch 210. By opening switches 206 and 208 the bypass signal path through bypass switch 214 is opened and/or placed in a high impedance state, thereby preventing signal conduction directly through bypass switch 214. RF switch 210 is closed in order to ground the parasitic feedthrough capacitance of switch 206 and switch 208 that may degrade the stability of LNA transistor 124.

In an embodiment, the operation mode of LNA module 200 may be selected by providing a digital control signal via control bus SER to serial interface 132 that controls the state of switches 206, 208, and 210, as well as the state of current source 134 that controls the amount of bias current conducted by LNA transistor 124. Control bus SER may be implemented using a parallel digital interface and/or a series digital interface such as an SPI, IIC, RFFE or other serial interface standard. In such embodiments, serial interface 132 also includes the appropriate digital interface circuitry, as well as decoding logic that places the various switches and adjustable components on LNA module 200 in their appropriate state based on the date received from control bus SER. In some embodiments, switch state selection may be addressable via a signal pin. In alternative embodiments of the present invention, non-standard digital interfaces may be used. Moreover, in some embodiments, matching networks and other circuit may be used as described in co-pending U.S. patent application Ser. No. 14/462,793 entitled "System and Method for a Low Noise Amplifier" filed on Aug. 19, 2014, which application is incorporated by reference herein in its entirety.

Figure 2B:
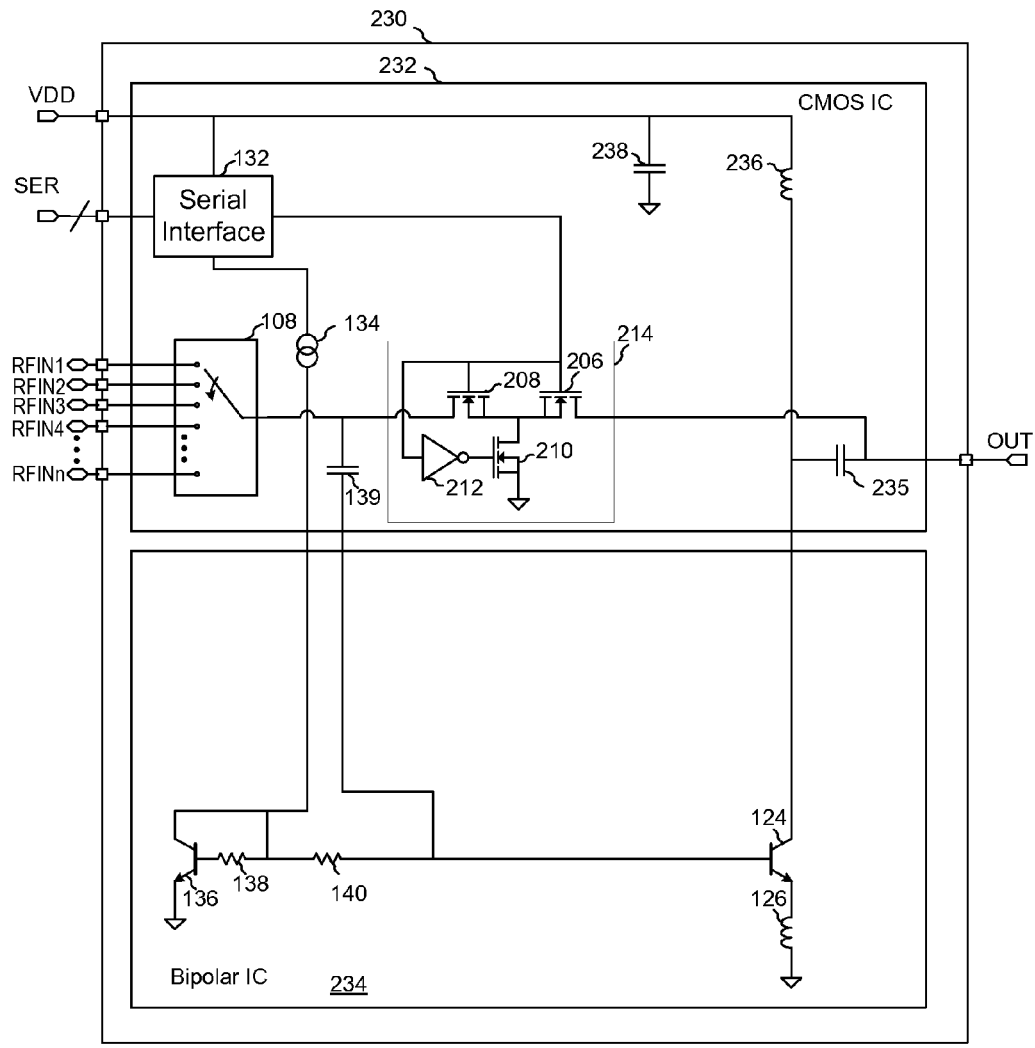

FIG. 2b illustrates embodiment LNA module 230 that includes switch integrated circuit 232 and LNA integrated circuit 234. As shown, switch integrated circuit 232 includes bypass switch 214, input coupling capacitor 139, inductor 236, LNA integrated circuit 234 and filter capacitor 238 in addition to serial interface 132, RF selection switch 108 and current source 134. Since switch integrated circuit 232 includes all components that may be implemented using a less expensive Bipolar technology that does not include MOS transistors. Alternatively, a BiCMOS, pHEMT or other process technology may be used to implement LNA integrated circuit 234. As shown, LNA integrated circuit 234 includes LNA transistor 124, degeneration inductor 126, diode connected biasing transistor 136, resistors 138 and 140. Inductor 236 and output coupling capacitor 235 function as a high-Q output matching network in some embodiments.

In some cases, output coupling capacitor 235 has relatively low value for the particular frequency. For example, in one embodiment that operates at about 2 GHz, 1 pF is used. Thus, it is possible to connect the bypass network directly to the module output. In this embodiment, implementing the amplifier output matching using a CMOS switch die results in a reduced number of chip interconnections and reduces the resulting number of parasitic couplings.

Figure 2C:
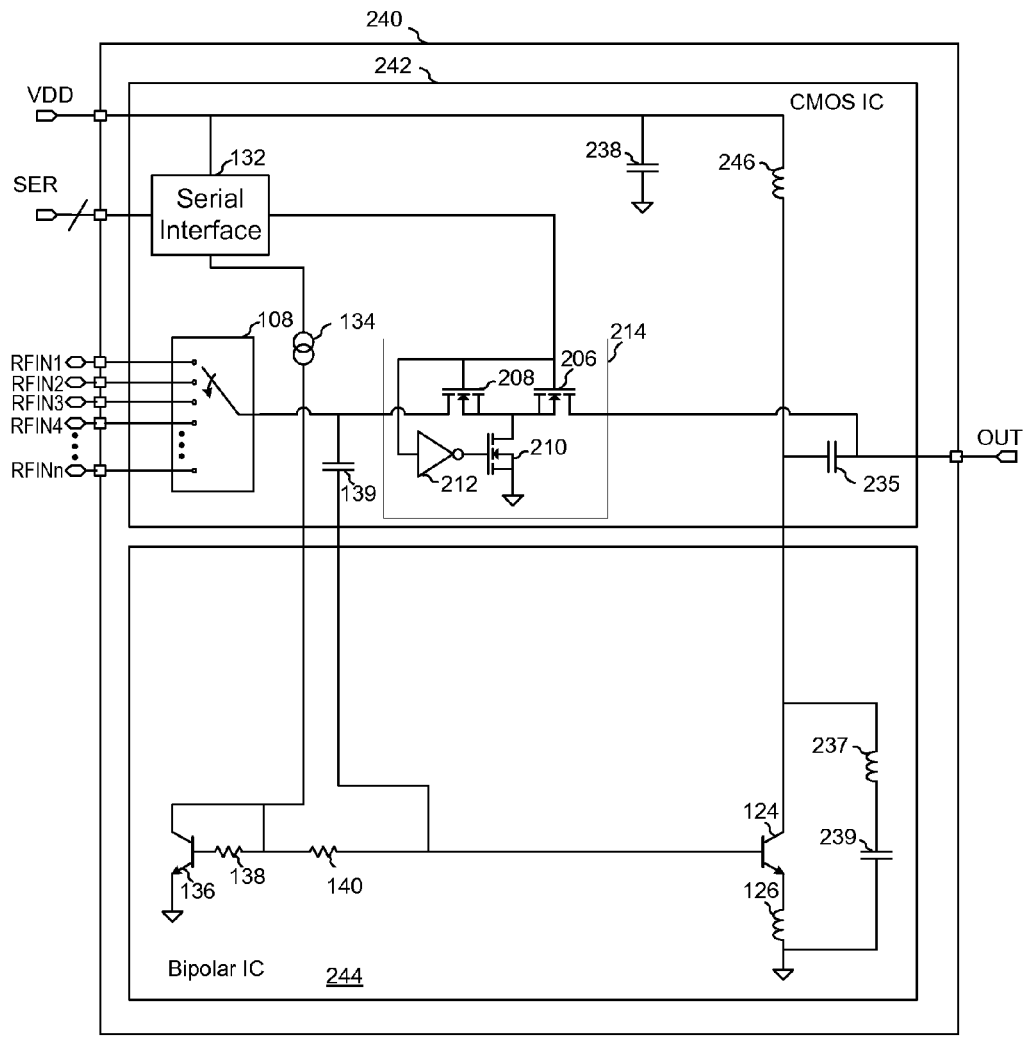

FIG. 2c illustrates LNA module 240 according to a further embodiments. As shown, LNA module 240 includes switch integrated circuit 242 and LNA integrated circuit 244. As shown, switch integrated circuit 242 includes choke inductor 246 that may be implemented a relatively low-Q component. In some embodiments, choke inductor 246 is just used for DC biasing and may have an inductance between about 10 nH and about 15 nH. Alternatively, values outside of this range may be used. In an embodiment, output matching of LNA transistor 124 is achieved using a series resonant network that includes inductor 237 and capacitor 239 disposed on LNA integrated circuit 244 and coupled to the output of LNA transistor 124. In some embodiments, output coupling capacitor 235 may also be considered a part of the output matching network.

In one example embodiment, output coupling capacitor 235 has a capacitance between about 0.5 pF and about 2 pF, inductor 237 has an inductance between about 3 nH and about 6 nH, and capacitor 239 has a capacitance between about 10 pF and about 20 pF. It should be understood that in alternative embodiments of the present invention, values outside of these ranges may also be used.

Figure 2D:
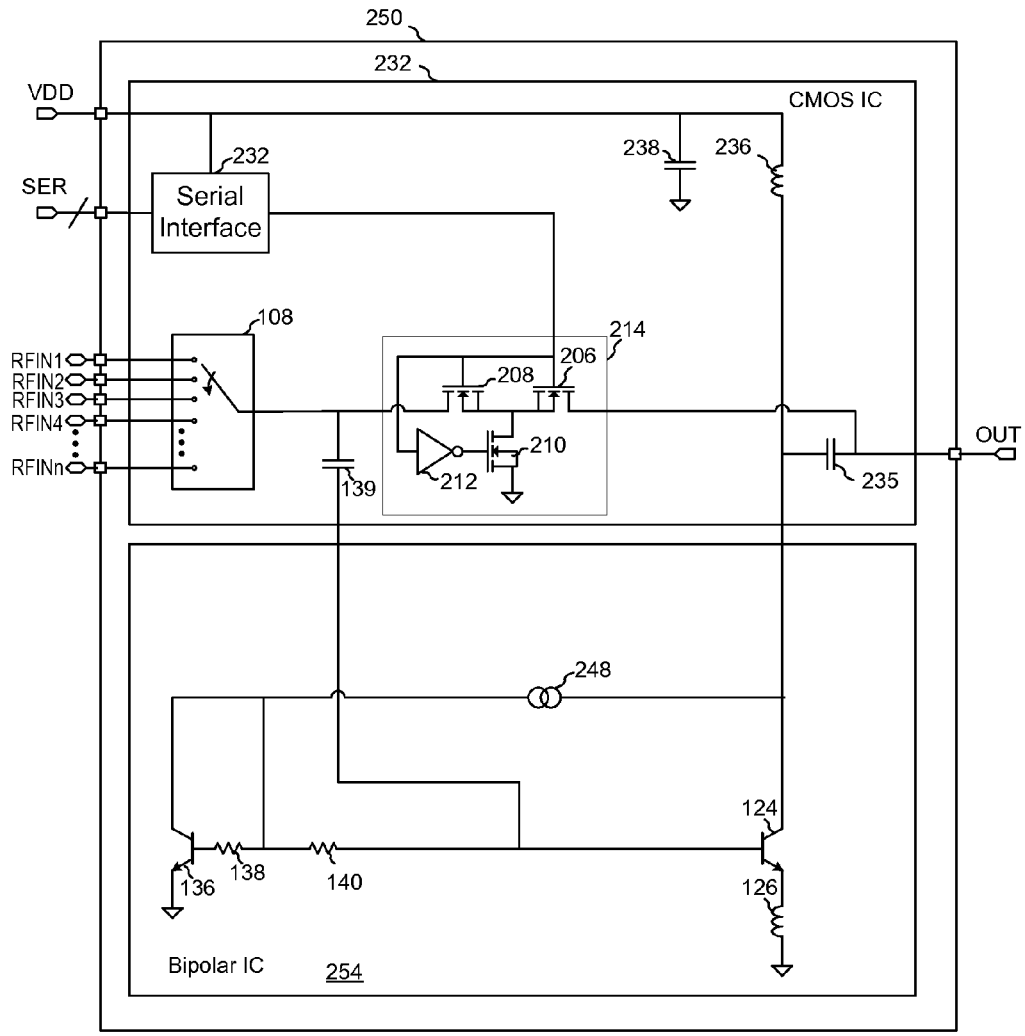

FIG. 2d illustrates LNA module 250 according to a further embodiment of the present invention. As shown, 250 includes switch integrated circuit 232 as described above and includes LNA integrated circuit 254 that includes LNA transistor 124, degeneration inductor 126, transistor 136, resistors 138 and 140 and current source 248 that may be implemented, for example, using resistors. In an embodiment, the current supplied to LNA transistor 124 may be controlled by regulating the voltage at power supply pin VDD. By placing current source 248 on LNA integrated circuit 254, the interface between switch integrated circuit 232 and 254 may be reduced to only two pins as shown.

Figure 3A:
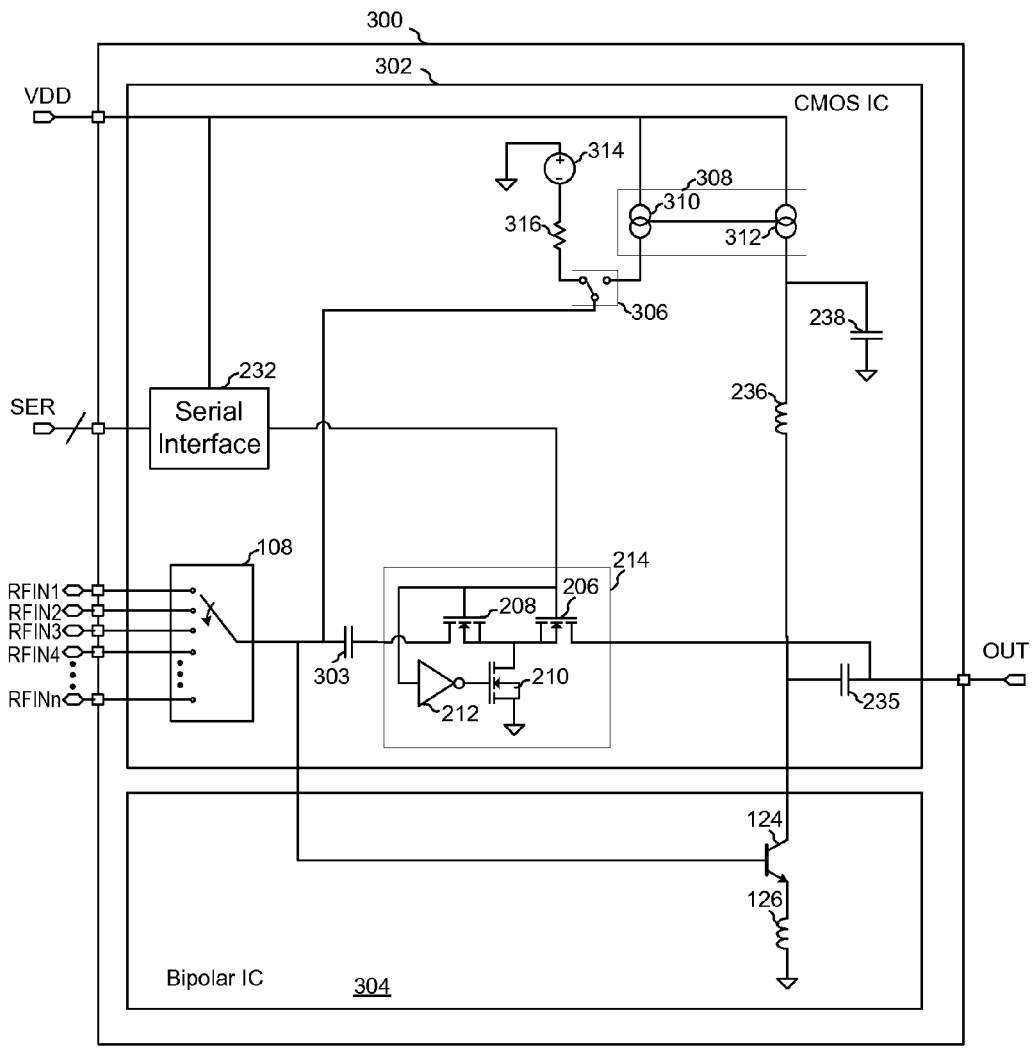
FIGS. 3a-3c illustrate LNA modules according to further embodiments.

FIG. 3a illustrates LNA module 300 according to an embodiment that includes switch integrated circuit 302 and LNA integrated circuit 304. As shown, LNA integrated circuit 304 includes a single LNA transistor 124 coupled to degeneration inductor 126 and has only two interfaces between switch integrated circuit 302 and LNA integrated circuit 304 according to one embodiment. As shown, switch integrated circuit 302 includes bias generator 308 that provides a bias to LNA transistor 124 when LNA transistor 124 is in an active mode and bypass switch 214 is off.

In some embodiments, bias generator 308 may also be implemented using a collector current sensing circuit, which may reduce self-driving by the RF signal and may improve linearity of LNA module 300 when LNA transistor 124 is active. One example of such a collector current sensing circuit is shown in FIG. 3d, which illustrates collector current sensing circuit 370. As shown, collector current sensing circuit includes PMOS transistors 356 and 358 that are degenerated with resistors 352 and 354, respectively. In addition, collector current sensing circuit 370 includes current source 362 and resistor 360. In an embodiment, the collector of transistor 124 is coupled to the Collector terminal at the source of transistor 358, while the base of transistor 124 is coupled to the Base terminal at resistor 360. Resistor 360 keeps the impedance at the base of transistor 124 high enough such that the input signal is not appreciably attenuated, thereby ensuring good noise performance.

During operation, the Collector terminal senses the current flowing though the collector of transistor 124. If the voltage at the collector terminal drops to a lower voltage, the source-drain current of transistor 358 decreases, thereby decreasing the base current available to transistor 124. As the base current to transistor 124 decreases, the amount of collector current decreases thereby increasing the voltage at the collector terminal coupled to the source of transistor 358. Accordingly, a negative feedback loop controls the collector current through transistor 124. In one embodiment, the current of current source 362 is set to about 500 nA and resistor 360 has a resistance of about 1 KΩ. Alternatively, other values may be used for the current of current source 362 and the value of resistor 306.

It should be understood that illustrates collector current sensing circuit 370 is just one example of many possible structures that may be used to implement bias generator 308. In alternative embodiments, other bias generation circuits known in the art may also be used.

In embodiments, LNA transistor 124 is bypassed when an input signal, such as an antenna signal is strong. In some cases, a strong input signal may pose linearity issues with respect to LNA transistor 124. For example, even when LNA transistor 124 is bypassed, the base-emitter junction of LNA transistor 124 is still coupled in parallel with bypass switch 214. At high signal levels, there is a possibility that non-linear behavior may result as a result of the input signal interacting with this base-emitter junction. In an embodiment, a negative DC voltage is applied to the base of LNA transistor 124 via negative voltage source 314 that is coupled to the base of LNA transistor 124 via resistor 316 and selector switch 306. By reverse biasing the base-emitter junction of LNA transistor 124, higher signal levels may be supported with less distortion when bypass switch 214 is activated. In an embodiment, negative voltage source 314 may be implemented using a charge pump or other negative voltage source known in the art. Selector switch 306 may be used to select between negative voltage source 314 when LNA transistor 124 is inactive and bias generator 308 when LNA transistor 124 is active. In order to ensure that bypass switch 214 has a positive bias when transistor 124 is bypassed, coupling capacitor 303 coupled between the base of transistor 124 and the input of bypass switch 214. Accordingly, the DC level of bypass switch 214 is established by its connection to output terminal OUT.

In an embodiment, switch integrated circuit 302 and LNA integrated circuit 304 is connected together using only two interface pins. In some embodiment, degeneration inductor 126 and inductor 236 are implemented using high Q components. Alternatively, low Q inductors may be used for inductors 126 and 236 and a series LC resonant circuit may be coupled to the output of LNA transistor 124 as is shown in FIG. 2c.

Figure 3B:
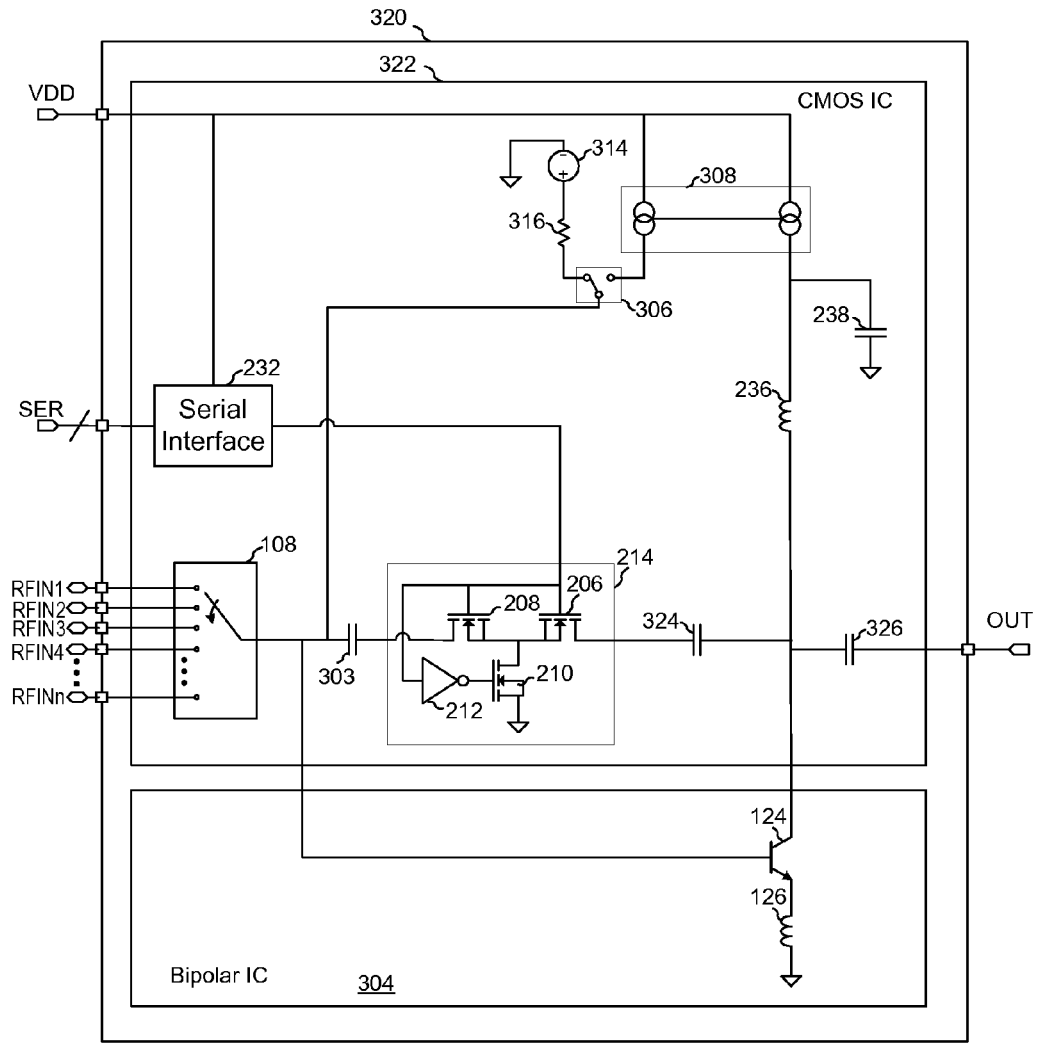
Figure 3C:
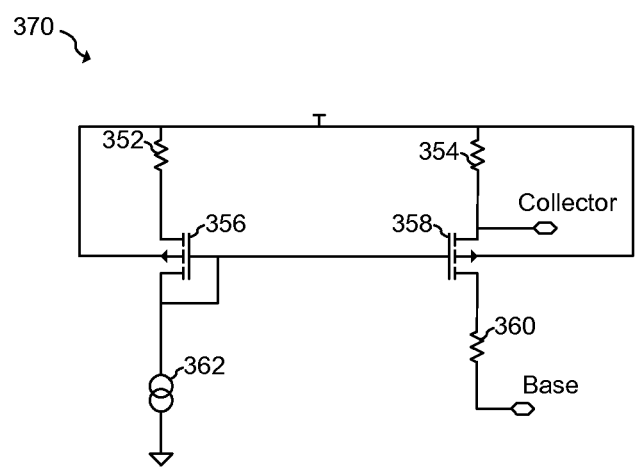

FIG. 3b illustrates LNA module 320 according to a further embodiment in which collector matching inductor 236 is reused as a matching network component when bypass switch 214 is activated. As shown, LNA module 320 includes switch integrated circuit 322 having bypass switch 214 coupled to the collector of LNA transistor 124 via coupling capacitor 324 instead of directly to the output of LNA module 320. In some embodiments, output coupling capacitor 326 is selected to have a relatively low impedance, for example, less than 10 ohms for the particular working frequency. For example, in one embodiment, output coupling capacitor 326 has a value of about 20 pF for a working frequency of about 1 GHz. Alternatively, other capacitance values may be used. Accordingly, inductor 236 may be used to match the output of bypass switch 214 when LNA transistor 124 is bypassed, and may be used to match the output of LNA transistor 124 when LNA transistor 124 is active.

Figure 4:
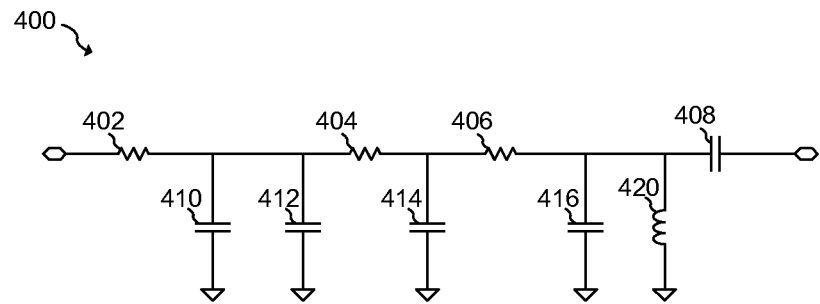
FIG. 4 illustrates a passive model of an embodiment signal path.

FIG. 4 illustrates a passive model of the embodiment signal path shown in FIG. 3b when the bypass switch is activated. Resistor 402 and capacitor 410 represent the on resistance and shunt capacitance of RF selection switch 108, capacitor 412 represents the input capacitance of LNA transistor 124, resistors 404 and 406 represent the resistances of RF switches 208 and 206, respectively, capacitor 414 represents the parasitic off capacitance of RF switch 210, capacitor 416 represents the collector capacitance of LNA transistor 124, inductor 420 represents the output inductance of inductor 236, and capacitor 408 represents the capacitance of the output coupling capacitor.

Figure 5:
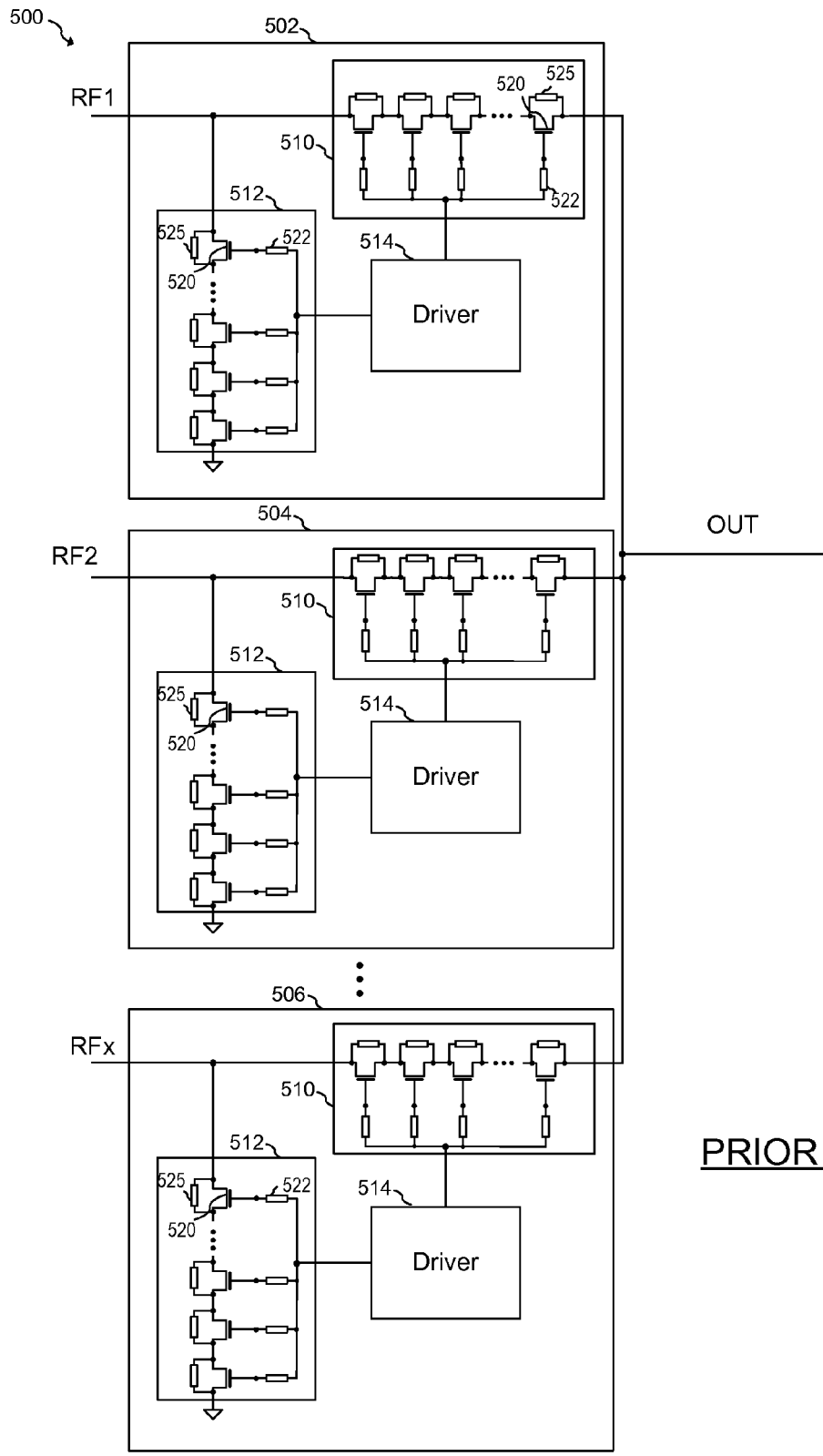
FIG. 5 illustrates an RF switch.

FIG. 5 illustrates conventional RF switch 400 that may be used to implement selection switch RF selection switch 108 of various embodiments described herein. As shown, each parallel RF switching network 502, 504 and 506 includes a series RF switch 510, a shunt RF switch 512 and a switch driver 514. During operation, a selected RF path is formed when driver 514 turns on series RF switch 510 and turns off shunt RF switch 512. Likewise, a RF path is deselected by turning off series RF switch 510 and turning on shunt RF switch 512. For example, input RF1 may be selected by activating RF switch 510 and deactivating RF switch 512 in RF switching network 502, while, at the same time, deactivating RF switch 510 and activating RF switch 512 in RF switching networks 504 and 506. Likewise, input RF2 may be selected by activating RF switch 510 and deactivating RF switch 512 in RF switching network 504, while, at the same time, deactivating RF switch 510 and activating RF switch 512 in RF switching networks 502 and 506.

Each RF switch 510 and 512 is implemented using a number of transistors 520 connected in series with each other. The source and drain of each transistor 520 is biased using resistor 525, and the gate is each transistor 520 has a series gate resistor 522. As shown, transistors 520 are stacked in order to withstand high voltages. The number of stacked transistors may vary according to the particular semiconductor technology used and the expected operating environment. It should be understood that RF switch 500 is one of many example selection switches that may be used to implement RF selection switch 108.

Figure 6:
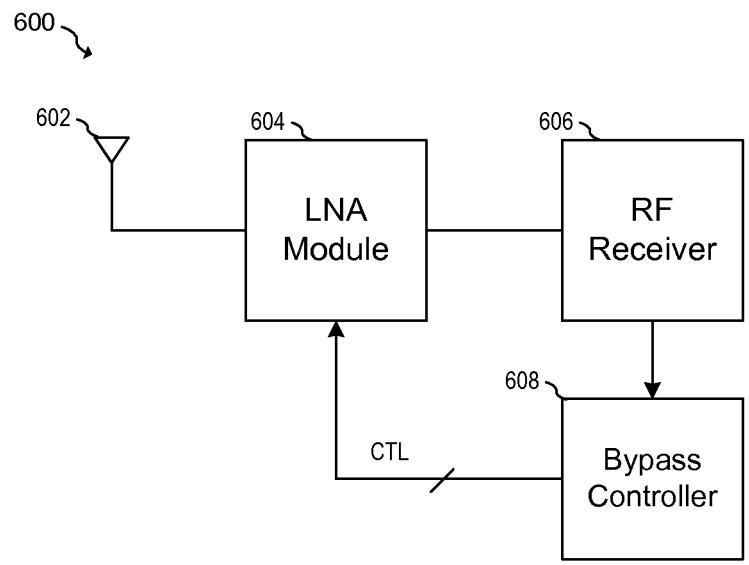
FIG. 6 illustrates an embodiment RF system.

FIG. 6 illustrates RF system 600 according to an embodiment of the present invention. As shown, RF system 600 includes antenna 602 coupled to RF receiver 606 via embodiment LNA module 604, which may be implemented at least according to any of the embodiments described herein. Bypass and matching controller 608 is configured to provide mode selection data to LNA module 604 based on input from RF receiver 606 or other controller. For example, when RF receiver 606 detects that the input signal from antenna 602 is at a high level, it may instruct bypass controller 608 to select the bypass mode.

Figure 7:
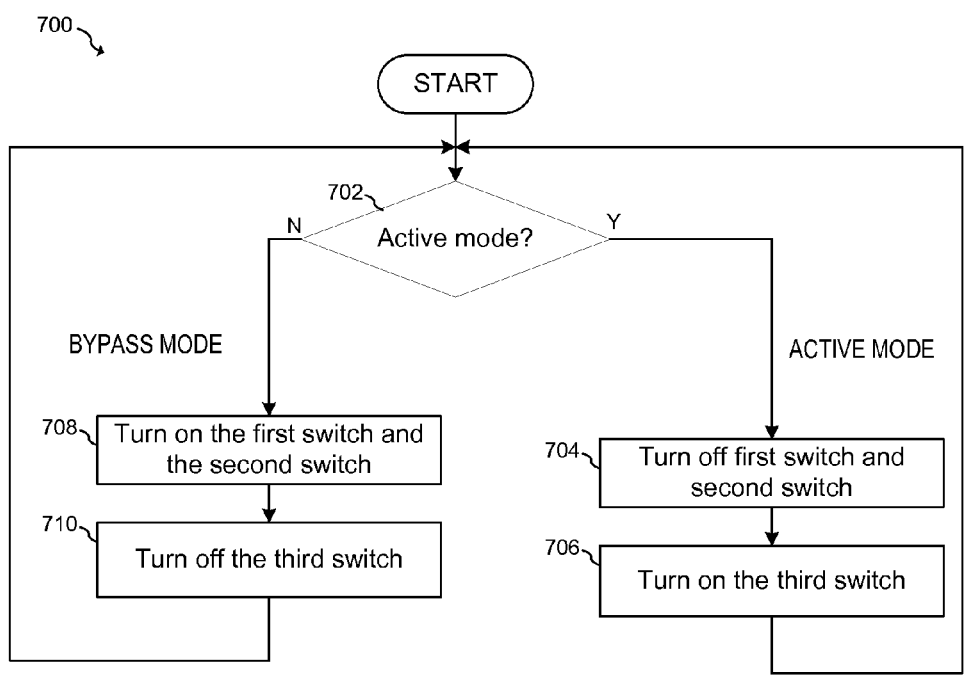
FIG. 7 illustrates a flowchart of an embodiment method.

FIG. 7 illustrates a flowchart of embodiment method 700 directed toward the operation of module comprising a low noise amplifier transistor disposed on a first integrated circuit, a single pole multi throw (SPMT) switch disposed on a second integrated circuit that couples a plurality of module input terminals to a control node of the low noise amplifier transistor, and a bypass switch coupled between a control node of the low noise amplifier transistor and an output node of the low noise amplifier transistor. The bypass switch includes a first switch coupled between the control node of the low noise amplifier transistor and an intermediate node, a second switch coupled between the intermediate node and the output node of the low noise amplifier transistor, and a third switch coupled between the intermediate node and a first reference node.

In step 702 of the method, a determination is made whether the LNA module is to be operated in an active mode with the LNA active, or in a bypass mode. If it is determined that the LNA module is to be operated in an active mode, the first and second switches are turned off in step 704 and the third switch is turned on in step 706. On the other hand, if it is determined that the LNA module is to be operated in the bypass mode, first and second switch are turned on in step 708 and the third switch is turned on in step 710.

In accordance with an embodiment, a circuit includes a low noise amplifier transistor disposed on a first integrated circuit, a single pole multi throw (SPMT) switch disposed on a second integrated circuit, and a bypass switch coupled between a control node of the low noise amplifier transistor and an output node of the low noise amplifier transistor. The SPMT switch couples a plurality of module input terminals to a control node of the low noise amplifier transistor, and the bypass switch including a first switch coupled between the control node of the low noise amplifier transistor and an intermediate node, a second switch coupled between the intermediate node and the output node of the low noise amplifier transistor, and a third switch coupled between the intermediate node and a first reference node. The first integrated circuit and the second integrated circuit are disposed on a substrate.

In various embodiments, the circuit further includes a control circuit configured to turn off the first switch and the second switch and turn on the third switch in an active mode. The control circuit is further configured to turn on the first switch and the second switch and turn off the third switch in a bypass mode.

The bypass switch may be disposed on the first integrated circuit. In some embodiments, the first integrated circuit includes a diode-connected transistor coupled to the control node of the low noise amplifier transistor and the second integrated circuit includes a current source coupled to the diode connected transistor. The first integrated circuit may include a first coupling capacitor coupled between the SPMT switch and the control node of the low noise amplifier transistor. In some embodiments, the circuit further includes a digital interface circuit disposed on the second integrated circuit, where the digital interface circuit has an input terminal configured to be coupled to a digital bus and a first output terminal coupled to a control terminal of the bypass switch. The digital interface may be configured to receive serial digital commands from the digital bus.

In some embodiments, the bypass switch is disposed on the second integrated circuit. The first integrated circuit may include a diode-connected transistor coupled to the control node of the low noise amplifier transistor, and the second integrated circuit may include a current source coupled to the diode connected transistor. In some embodiments, the second integrated circuit includes a first coupling capacitor coupled between the SPMT switch and the control node of the low noise amplifier transistor, and a second coupling capacitor coupled between the output node of the low noise amplifier transistor and the output node of the module.

The first integrated circuit further may further include a series LC circuit coupled between an output of the low noise amplifier transistor and the first reference node. The series LC circuit includes a first inductor coupled in series with a first capacitor in some embodiments. The first integrated circuit may further include a diode-connected transistor coupled to the control node of the low noise amplifier transistor, and a current source coupled between an output node of the low noise amplifying transistor and the diode connected transistor.

In an embodiment, the second integrated circuit further includes a first coupling capacitor coupled between the SPMT switch and the control node of the low noise amplifier transistor, and a second coupling capacitor coupled between the output node of the low noise amplifying transistor and an output terminal of the module, where the second switch of the bypass switch is connected to the output terminal of the module. The second integrated circuit may also include a bias circuit coupled to the control node and to the output node of the low noise amplifying transistor. In some embodiments, the second integrated circuit further includes a first coupling capacitor coupled between the control node of the low noise amplifier transistor and the first switch of the bypass switch.

In an embodiment, the second switch of the bypass switch is connected to an output node of the module, and the second integrated circuit further includes a second coupling capacitor coupled between the output node of the low noise amplifying transistor and the output node of the module. The second integrated circuit may further include a second coupling capacitor coupled between the second switch of the bypass switch and the output node of the low noise amplifying transistor, and a third bypass capacitor coupled between the output node of the low noise amplifying transistor and an output node of the module. In some embodiments, the circuit further includes a second inductor coupled between a reference node of the low noise amplifier transistor and the first reference node. The low noise amplifying transistor may be implemented using a bipolar transistor.

In accordance with a further embodiment, a method is directed toward operating a module including a low noise amplifier transistor disposed on a first integrated circuit, a single pole multi throw (SMPT) switch disposed on a second integrated circuit and a bypass switch coupled between a control node of the low noise amplifier transistor and an output node of the low noise amplifier transistor. The SPMT switch couples a plurality of module input terminals to a control node of the low noise amplifier transistor and the bypass switch includes a first switch coupled between the control node of the low noise amplifier transistor and an intermediate node, a second switch coupled between the intermediate node and the output node of the low noise amplifier transistor, and a third switch coupled between the intermediate node and a first reference node, where the first integrated circuit and the second integrated circuit are disposed on a substrate. The method includes, in an active mode, turning off the first switch and the second switch, and turning on the third switch. The method further includes turning on the first switch and the second switch, and turning off the third switch in a bypass mode.

In some embodiments, the bypass switch is disposed on the first integrated circuit, while, in other embodiments, the bypass switch is disposed on the second integrated circuit. The module may further including a second coupling capacitor having a first terminal coupled to the bypass switch and to an output terminal of the module, and a second terminal coupled the collector terminal of the bipolar transistor.

In accordance with a further embodiment, a module includes a bipolar transistor chip including a bipolar transistor and a first inductor coupled between an emitter of the bipolar transistor and a reference terminal, and a CMOS chip including a single pole multi throw (SPMT) switch having a plurality of module input terminals and a bypass switch coupled between an output node of the SPMT switch and a collector terminal of the bipolar transistor. The bypass switch includes a first switch coupled between the output node of the SPMT switch and an intermediate node, a second switch coupled between the intermediate node and the collector terminal of the bipolar transistor, and a third switch coupled between the intermediate node and a first reference node. The CMOS chip further includes a bias generator coupled between a base terminal and a collector terminal of the bipolar transistor, and includes a first coupling capacitor having a first terminal coupled to the output node of the SPMT switch and to the bypass switch, and a second terminal coupled to the base terminal of the bipolar transistor.

The module may further include a second coupling capacitor having a first terminal coupled to the bypass switch and to an output terminal of the module, and a second terminal coupled the collector terminal of the bipolar transistor. In an embodiment, the module further includes a second coupling capacitor having a first terminal coupled to the bypass switch and a second terminal coupled to the collector terminal of the bipolar transistor, and a third coupling capacitor having a first terminal coupled to the collector terminal of the bipolar transistor and a second terminal coupled to an output terminal of the module.

In some embodiments, CMOS chip includes a second inductor coupled between the bias generator and a collector terminal of the bipolar transistor. The CMOS chip may further include a negative voltage generator having an output terminal configured to be coupled the base terminal of the bipolar transistor when the bypass switch is activated.

Advantages of some embodiment LNA modules include the ability to bypass an LNA in when an input RF signal has a high amplitude. In such a situation, bypassing the LNA may save current. A further advantage of some embodiments that include a "T" bypass switch that reduces and/or eliminates a parasitic feedback path is the ability to provide a circuit capable of bypassing a LNA while maintaining stable operation in the active mode. In embodiments, in which no switches are coupled in series with the input of the LNA, better noise performance is achieved because attenuation caused the resistance of such series switches does not degrade the noise performance of the system. A further advantage of some embodiments includes better linearity.

Further advantages of some embodiments lower cost due to the ability to implement the LNA using a relatively inexpensive Bipolar process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:
1. A circuit comprising:
   a low noise amplifier transistor disposed on a first integrated circuit;
   a single pole multi throw (SPMT) switch disposed on a second integrated circuit, the SPMT switch coupling a plurality of module input terminals to a control node of the low noise amplifier transistor; and
   a bypass switch coupled between a control node of the low noise amplifier transistor and an output node of the low noise amplifier transistor, the bypass switch comprising a first switch coupled between the control node of the low noise amplifier transistor and an intermediate node, a second switch coupled between the intermediate node and the output node of the low noise amplifier transistor, and a third switch coupled between the intermediate node and a first reference node, wherein the first integrated circuit and the second integrated circuit are disposed on a substrate.

2. The circuit of claim 1, further comprising a control circuit configured to:
in an active mode, turn off the first switch and the second switch, and turn on the third switch; and
in a bypass mode, turn on the first switch and the second switch, and turn off the third switch.

3. The circuit of claim 1, wherein the bypass switch is disposed on the first integrated circuit.

4. The circuit of claim 3, wherein:
the first integrated circuit comprises a diode-connected transistor coupled to the control node of the low noise amplifier transistor; and
the second integrated circuit comprises a current source coupled to the diode-connected transistor.

5. The circuit of claim 4, wherein the first integrated circuit comprises:
a first coupling capacitor coupled between the SPMT switch and the control node of the low noise amplifier transistor.

6. The circuit of claim 1, further comprising a digital interface circuit disposed on the second integrated circuit, the digital interface circuit having an input terminal configured to be coupled to a digital bus and a first output terminal coupled to a control terminal of the bypass switch.

7. The circuit of claim 6, wherein the digital interface circuit is configured to receive serial digital commands from the digital bus.

8. The circuit of claim 1, wherein the bypass switch is disposed on the second integrated circuit.

9. The circuit of claim 8, wherein:
the first integrated circuit comprises a diode-connected transistor coupled to the control node of the low noise amplifier transistor; and
the second integrated circuit comprises a current source coupled to the diode-connected transistor.

10. The circuit of claim 9, wherein
the second integrated circuit comprises a first coupling capacitor coupled between the SPMT switch and the control node of the low noise amplifier transistor, and a second coupling capacitor coupled between the output node of the low noise amplifier transistor and an output node of the circuit.

11. The circuit of claim 10, wherein the first integrated circuit further comprises a series LC circuit coupled between an output of the low noise amplifier transistor and the first reference node, the series LC circuit comprising a first inductor coupled in series with a first capacitor.

12. The circuit of claim 8, wherein the first integrated circuit further comprises a diode-connected transistor coupled to the control node of the low noise amplifier transistor, and a current source coupled between an output node of the low noise amplifier transistor and the diode-connected transistor.

13. The circuit of claim 8, wherein the second integrated circuit further comprises:
a first coupling capacitor coupled between the SPMT switch and the control node of the low noise amplifier transistor; and
a second coupling capacitor coupled between the output node of the low noise amplifier transistor and an output terminal of the circuit, wherein the second switch of the bypass switch is connected to the output terminal of the circuit.

14. The circuit of claim 8, wherein the second integrated circuit further comprises a bias circuit coupled to the control node and to the output node of the low noise amplifier transistor.

15. The circuit of claim 14, wherein the second integrated circuit further comprises a first coupling capacitor coupled between the control node of the low noise amplifier transistor and the first switch of the bypass switch.

16. The circuit of claim 14, wherein the second switch of the bypass switch is connected to an output node of the circuit, and the second integrated circuit further comprises a second coupling capacitor coupled between the output node of the low noise amplifier transistor and the output node of the circuit.

17. The circuit of claim 14, wherein the second integrated circuit further comprises a second coupling capacitor coupled between the second switch of the bypass switch and the output node of the low noise amplifier transistor, and a third bypass capacitor coupled between the output node of the low noise amplifier transistor and an output node of the circuit.

18. The circuit of claim 1, further comprising a second inductor coupled between a reference node of the low noise amplifier transistor and the first reference node.

19. The circuit of claim 1, wherein the low noise amplifier transistor comprises a bipolar transistor.

20. A method of operating a module comprising a low noise amplifier transistor disposed on a first integrated circuit, a single pole multi throw (SPMT) switch disposed on a second integrated circuit, the SPMT switch coupling a plurality of module input terminals to a control node of the low noise amplifier transistor, and a bypass switch coupled between a control node of the low noise amplifier transistor and an output node of the low noise amplifier transistor, the bypass switch comprising a first switch coupled between the control node of the low noise amplifier transistor and an intermediate node, a second switch coupled between the intermediate node and the output node of the low noise amplifier transistor, and a third switch coupled between the intermediate node and a first reference node, wherein the first integrated circuit and the second integrated circuit are disposed on a substrate, the method comprising:
in an active mode, turning off the first switch and the second switch, and turning on the third switch; and
in a bypass mode, turning on the first switch and the second switch, and turning off the third switch.

21. The method of claim 20, wherein the bypass switch is disposed on the first integrated circuit.

22. The method of claim 20, wherein the bypass switch is disposed on the second integrated circuit.

23. A module comprising:
a bipolar transistor chip comprising a bipolar transistor and a first inductor coupled between an emitter of the bipolar transistor and a reference terminal; and
a CMOS chip comprising:
a single pole multi throw (SPMT) switch comprising a plurality of module input terminals,
a bypass switch coupled between an output node of the SPMT switch and a collector terminal of the bipolar transistor, the bypass switch comprising a first switch coupled between the output node of the SPMT switch and an intermediate node, a second switch coupled between the intermediate node and the collector terminal of the bipolar transistor, and a third switch coupled between the intermediate node and a first reference node,
a bias generator coupled between a base terminal and a collector terminal of the bipolar transistor, and a first coupling capacitor having a first terminal coupled to the output node of the SPMT switch and to the bypass switch, and a second terminal coupled to the base terminal of the bipolar transistor.

24. The module of claim 23, further comprising a second coupling capacitor having a first terminal coupled to the bypass switch and to an output terminal of the module, and a second terminal coupled the collector terminal of the bipolar transistor.

25. The module of claim 23, further comprising:
a second coupling capacitor having a first terminal coupled to the bypass switch and a second terminal coupled to the collector terminal of the bipolar transistor; and
a third coupling capacitor having a first terminal coupled to the collector terminal of the bipolar transistor and a second terminal coupled to an output terminal of the module.

26. The module of claim 23, wherein the CMOS chip comprises a second inductor coupled between the bias generator and a collector terminal of the bipolar transistor.

27. The module of claim 23, wherein the CMOS chip further comprises a negative voltage generator having an output terminal configured to be coupled the base terminal of the bipolar transistor when the bypass switch is activated.

* * * * *